United States Patent
Lin et al.

(10) Patent No.: US 6,188,578 B1
(45) Date of Patent: Feb. 13, 2001

(54) INTEGRATED CIRCUIT PACKAGE WITH MULTIPLE HEAT DISSIPATION PATHS

(75) Inventors: Po-Yao Lin, Taipei; Ching-Bai Hwang, HsinChu, both of (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/379,599

(22) Filed: Aug. 24, 1999

(30) Foreign Application Priority Data

Jun. 11, 1999 (TW) ................................................ 88209607

(51) Int. Cl.[7] ...................................................... H05K 7/20
(52) U.S. Cl. .................. 361/717; 361/704; 361/707; 361/718; 361/719; 257/706; 257/717; 174/16.3; 165/80.2; 165/80.3; 165/185
(58) Field of Search ..................................... 361/688, 702, 361/704, 712, 717–720; 257/706, 712, 717, 718, 721, 722; 165/80.2, 80.3, 185; 174/16.3

(56) References Cited

U.S. PATENT DOCUMENTS

| | | | | |
|---|---|---|---|---|
| 4,914,551 | * | 4/1990 | Anschel et al. | 361/714 |
| 5,459,352 | * | 10/1995 | Layton et al. | 157/724 |
| 5,504,652 | * | 4/1996 | Foster et al. | 361/704 |
| 5,710,459 | * | 1/1998 | Teng et al. | 257/717 |
| 5,870,285 | * | 2/1999 | Kosteva et al. | 361/704 |
| 5,898,571 | * | 4/1999 | Mertol | 361/704 |
| 5,920,458 | * | 7/1999 | Azar | 361/704 |
| 5,926,371 | * | 7/1999 | Dolbear | 361/704 |
| 5,933,324 | * | 8/1999 | Barrett | 361/703 |
| 6,008,536 | * | 12/1999 | Mertol | 257/704 |

FOREIGN PATENT DOCUMENTS

407106721 * 4/1995 (JP).

* cited by examiner

*Primary Examiner*—Leo P. Picard
*Assistant Examiner*—Boris L. Chervinsky
(74) *Attorney, Agent, or Firm*—Pollock, Vande Sande & Amernick

(57) ABSTRACT

An integrated circuit package has a printed circuit board, a die mounted on the printed circuit board, and a heat spreader attached to the printed circuit board to cover the die and contact with the backside of the die. The heat spreader is formed by a piece body and a plurality of supporting leads extended downward from the periphery of the piece body. The supporting leads of the heat spreader are attached to the printed circuit board by surface mounting technology. The piece body of the heat spreader abuts on the backside of the die so that heat from the die can be conducted both upward to the outer environment and downward to the printed circuit board through the heat spreader, thereby enhancing the heat dissipation efficiency.

8 Claims, 2 Drawing Sheets

INTEGRATED CIRCUIT PACKAGE WITH MULTIPLE HEAT DISSIPATION PATHS

BACKGROUND OF THE INVENTION

1. Field of the Invention

The present invention relates to an integrated circuit package, and more particularly, to an integrated circuit package with a heat spreader to dissipate heat.

2. Description of Related Art

Because the integrated circuit semiconductor device is getting more complicated in function and smaller in size, the flip chip semiconductor device is seeing more wide-spread use, since flip chip mounting permits a high component density and fast accessing time. FIG. 4 shows a conventional integrated circuit package which is of a well known "flip chip on board" type packaging. By welding the solder bumps 42 of a die 40 to a printed circuit board 41, the die 40 is electrically connected to the printed circuit board 41. An underfill 43 is injected between the die 40 and the printed circuit board 41 to securely consolidate the die 40 with the printed circuit board 41 so that the solder joints between the die 40 and the printed circuit board 41 will not be damaged due to different degrees of thermal expansion of the die 40 and the printed circuit board 41 upon thermal excursions, which the integrated circuit semiconductor device experiences during operation.

However, due to the fact that the aforementioned flip chip semiconductor device is of small volume and with high power density, the thermal resistance greatly increases. The major heat dissipation paths are from the backside of the die 40 to the environment and from the lower portion of the die 40 to the printed circuit board 41. Unfortunately, the underfill filled between the die 40 and the printed circuit board 41 is of an insulating material, such as epoxy resin, whose heat conducting capability is extremely low. Therefore, the heat from the die 40 is difficult to be conducted to the printed circuit board 41 and the heat dissipation capability of such a flip chip semiconductor device is unsatisfactory.

In order to eliminate the aforementioned heat dissipating problem, an additional heat cap or heat spreader may be employed to assist in dissipating heat. FIG. 5 shows a flip chip integrated circuit package having a die 50 attached to a substrate 53 that is mounted on a printed circuit board 54. A metal heat sink 51 is further mounted on the top of the die 50 via adhesive 52 such that the heat from the die 50 is dissipated to the heat sink 51. With such a flip chip packaging structure, the effective heat dissipating area can be increased by using the heat sink 51. However, the heat sink 51 is secured to the die 50 by adhesive 52, thus the load on the die 50 is heavy so that the connection between the die 50 and the substrate 53 is likely to be damaged due to stress generated by the heavy load. Therefore, the reliability of such a packaged semiconductor device is difficult to promote.

Alternatively, FIG. 6 shows a flip chip integrated circuit package, which has a metal heat cap 61 disposed on a substrate 63 to cover a die 60. The heat cap 61 is adhered to the substrate 63 through epoxy resin 62. A heat conductive adhesive 64 is filled between the heat cap 61 and the die 60. Thus, the heat from the die 60 can be dissipated out through the heat cap 61. With such a packaging structure, the heat cap 61 is adhered to the substrate 63 through the epoxy resin 62 that is unable to transfer heat. Thus, the heat can not be effectively conducted to the substrate 63 to be dissipated. Moreover, the aforementioned heat sink 51 and the heat cap 61 are with large footprints with respect to that of the die 50, 60. However, since the density of the electronic package is getting higher and the size of electronic product is getting smaller, adding such large heat dissipation elements to the flip chip device is obviously undesired, as it will greatly increase the space required by the flip chip device. Thus, there is a need for the above integrated circuit packages to be improved.

Among the known patents related to the heat dissipation of a flip chip integrated circuit package, U.S. Pat. No. 5,847,929 granted to Bernier et al. has disclosed the use of an adhesive of silicone or flexible-epoxy to attach a heat sink to a semiconductor chip. U.S. Pat. No. 5,726,079 granted to Johnson has provided a thermally conductive planar member in packaging a flip chip. U.S. Pat. No. 5,650,662 granted to Edwards et al. has disclosed a heat spreader that is directly bonded to an electronic device package. U.S. Pat. No. 5,856,911 granted to Riley has provided an integrated circuit package having a top die attach area and a bottom heat spreader thermally coupled to the die. The above patents are provided to dissipate heat out of integrated circuit packages with only one heat dissipation path which us from the die upward to the environment. Therefore, they can not be used to effectively solve the aforementioned heat dissipation problems.

SUMMARY OF THE INVENTION

Accordingly, the object of the present invention is to provide an integrated circuit package having a heat spreader to dissipate heat generated by a die both from the backside of the die and by conducting to the printed circuit board, so as to improve the heat dissipating effect. Moreover, the installation of the heat spreader will not increase the load of the die.

To achieve the object, an integrated circuit package is provided which has a printed circuit board and a die attached to the printed circuit board. A heat spreader secured to the printed circuit board is provided to cover the die and contact with the backside of the die, so that heat from the die can be transferred upward to the environment and downward to the printed circuit board through the heat spreader. Further, since the heat spreader is secured to the printed circuit board, no additional load is added to the die.

The various objects and advantages of the present invention will be more readily understood from the following detailed description when read in conjunction with the appended drawing.

DETAILED DESCRIPTION OF THE PREFERRED EMBODIMENT

Figure 1:
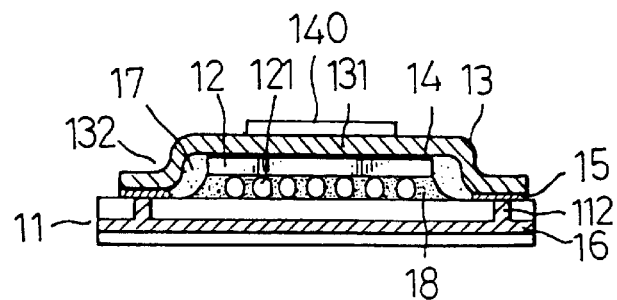
FIG. 1 is a side cross sectional view of an integrated circuit package in accordance with the present invention.

A preferred embodiment of an integrated circuit package with multiple heat dissipation paths in accordance with the present invention is illustrated in FIG. 1, which has a die 12 attached to a printed circuit board 11. The die 12 has multiple solder bumps 121 at the bottom thereof to mount to the surface of the printed circuit board 11. An underfill 18 is applied between the die 12 and the printed circuit board 11. A heat spreader 13 is provided to cover the die 12. The heat spreader 13 contacts with the backside of the die 12 and is adhered to the printed circuit board 11 for providing additional heat dissipation for the die 12.

Figure 2:
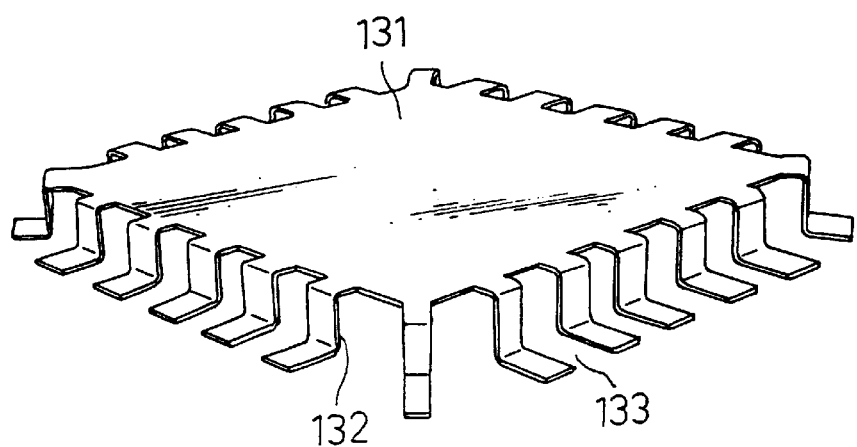
FIG. 2 is a perspective view showing a heat spreader of the integrated circuit package in accordance with the present invention.
Figure 4:
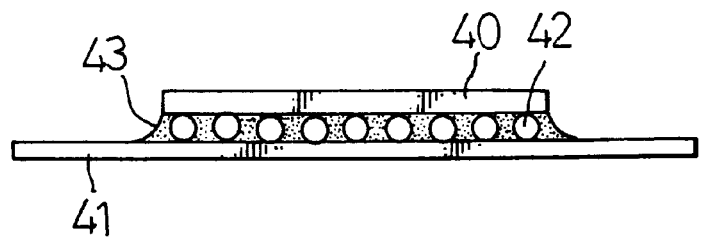
FIG. 4 is a side cross sectional view of a conventional flip chip integrated circuit package.
Figure 6:
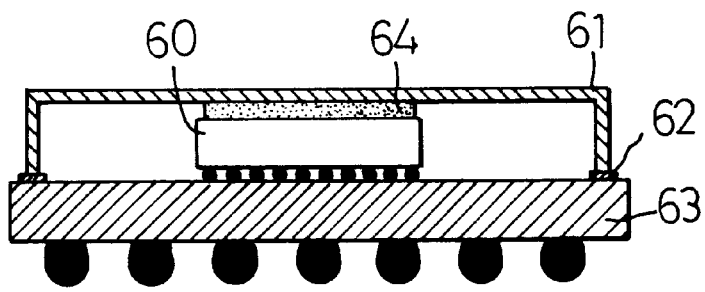
FIG. 6 is a side cross sectional view of a conventional flip chip package with a heat cap.
Figure 5:
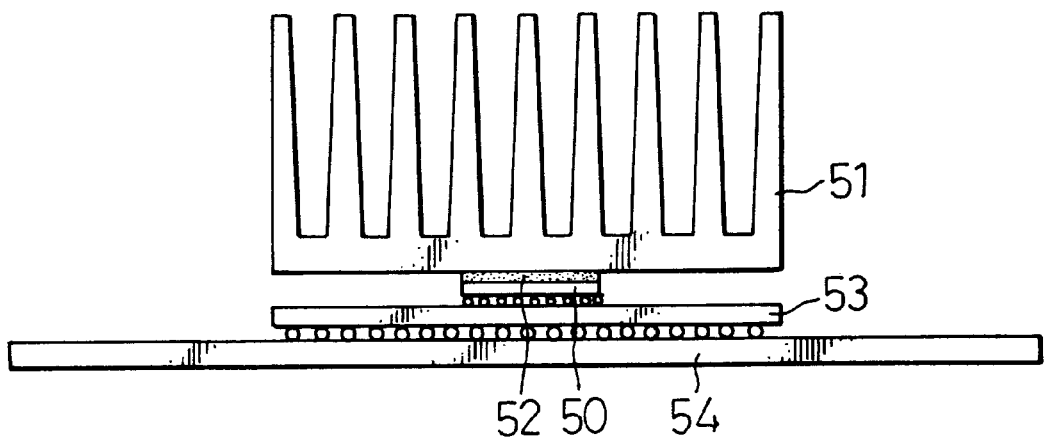
FIG. 5 is a side view of a conventional flip chip integrated circuit package with a heat sink.

With reference to FIG. 2, the heat spreader 13 is preferred to have a shape similar to a lead frame known in the art of integrated circuit packaging. That is, the heat spreader 13 is formed by a rectangular piece body 131 and a plurality of supporting leads 132 extended downward from the periphery of the piece body 131. It is preferable that the heat spreader 13 is made of metal with a high thermal conductivity, such as copper or aluminum.

Referring to FIG. 1 again, the heat spreader 13 of lead frame type is mounted on the printed circuit board 11 in such a manner that the supporting leads 132 thereof stand on the printed circuit board 11, and the piece body 131 substantially abuts on the backside of the die 12. A high thermal conductivity interface, such as thermal grease, is filled between the piece body 131 and the die 12. Therefore, the heat of the die 12 can be conducted upward and thus transferred to the outer environment through the heat spreader 13. Moreover, each supporting lead 132 is spaced from the adjacent one so that a gap 133 is defined between two adjacent supporting leads 132 to allow circuit connection to be directed to the die 13 thereby enabling the transfer of signals to and from the die 12.

Figure 3:
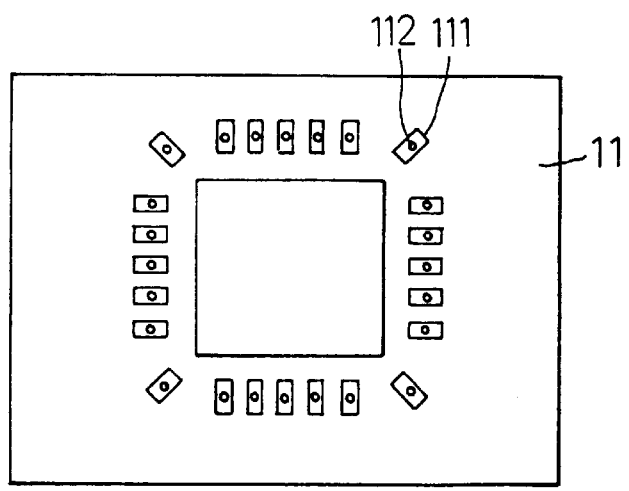
FIG. 3 is a top view of a printed circuit board used in the integrated circuit package in accordance with the present invention.

With reference to FIG. 3, the surface of the printed circuit board 11 is formed with a plurality of thermal pads 111 disposed around the die 12. At the center of each of the thermal pad 111, a thermal via hole 112 is defined. With reference to FIG. 1 again, the plurality of supporting leads 132 of the heat spreader 13 are secured to the plurality of thermal pads 111 of the printed circuit board 11, respectively, through solder 15 by surface mounting technology (SMT). Moreover, the printed circuit board 11 has an inner-layered copper plane 16, and the plurality of thermal via holes 112 are connected to the inner-layered copper plane 16. Therefore, other than dissipating heat upwards and out to the environment through the heat spreader 13, the heat from the die 12 can be downwardly conducted to the inner-layered copper plane 16 of the printed circuit board 11 through the plurality of supporting leads 132 and the thermal via holes 112. Accordingly, multiple heat dissipation paths are provided, and an enhanced efficiency of heat dissipation is achieved. Furthermore, the dimension of such an integrated circuit packaging is small so that it can be used in a circuit design requiring a small footprint. Additionally, the aforementioned thermal via holes 112 are not restricted to be defined within the thermal pads 111. It is also applicable to define thermal via holes at positions away from the thermal pads, and such thermal via holes are connected to the corresponding thermal pads by conductive traces plated on the printed circuit board, thereby achieving the same heat dissipation effect.

Other than the enhanced heat dissipation effect, the heat spreader 13 of the integrated circuit package is secured to the printed circuit board 11 by surface mounting technology. Thus, in addition to the known SMT process, no extra process is required to secure the heat spreader 13 to the printed circuit board 11, and the installation of the heat spreader 13 will not become a load to the die 12.

Furthermore, since the heat spreader 13 abuts on the die 12 via thermal grease 14 and without adhesiveness, no stress will be applied to the die 12. Therefore, the reliability of the integrated circuit package can be greatly increased.

With reference to FIGS. 1 and 3 again, material with high thermal conductivity, such as conductive adhesive, can be filled between the plurality of supporting leads 132 of the heat spreader 13 and the die 12. The conductive adhesive 17 is condensed in the gaps 133 between the supporting leads 132 by surface tension effect and will not escape out of the heat spreader 13. Thus, the stability of the integrated circuit package and the heat dissipation efficiency can be further enhanced. Besides, an additional heat sink 140 can be mounted onto the piece body 131 of the heat spreader 13 to provide extra heat dissipation area, thereby enhancing the heat dissipation effect.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An integrated circuit package comprising:
   a printed circuit board;
   a die attached to the printed circuit board; and
   a heat spreader covering the die, the heat spreader contacting with backside of the die and being mounted to the printed circuit board;
   wherein the heat spreader is formed by a piece body and a plurality of supporting leads extended downward from a periphery of the piece body;
   the printed circuit board has a surface formed thereon a plurality of thermal pads disposed around the die; and
   the plurality of supporting leads of the heat spreader are secured to the plurality of thermal pads on the printed circuit board, respectively.

2. The integrated circuit package as claimed in claim 1, wherein the piece body of the heat spreader abuts on the backside of the die, an interface with high thermal conductivity being filled between the piece body and the die.

3. The integrated circuit package as claimed in claim 2, wherein the interface with high thermal conductivity is thermal grease.

4. The integrated circuit package as claimed in claim 1, wherein the printed circuit board defines a plurality of thermal via holes at positions where the plurality of thermal pads are formed, respectively.

5. The integrated circuit package as claimed in claim 1, wherein the printed circuit board has an inner-layered copper plane, the plurality of thermal via holes being connected to the inner-layered copper plane.

6. The integrated circuit package as claimed in claim 1, wherein an additional heat sink is further mounted onto the piece body of the heat spreader.

7. The integrated circuit package as claimed in claim 1, wherein material with high thermal conductivity is filled between the plurality of supporting leads and the die.

8. The integrated circuit package as claimed in claim 1, wherein the material with high conductivity is thermal grease.

* * * * *

US006188578C1

(12) EX PARTE REEXAMINATION CERTIFICATE (8745th)
United States Patent
Lin et al.

(10) Number: US 6,188,578 C1
(45) Certificate Issued: Dec. 13, 2011

(54) INTEGRATED CIRCUIT PACKAGE WITH MULTIPLE HEAT DISSIPATION PATHS

(75) Inventors: Po-Yao Lin, Taipei (TW); Ching-Bai Hwang, HsinChu (TW)

(73) Assignee: HTC Corporation, Taoyuan, Taoyuan County (TW)

Reexamination Request:
No. 90/011,487, Mar. 3, 2011

Reexamination Certificate for:
Patent No.: 6,188,578
Issued: Feb. 13, 2001
Appl. No.: 09/379,599
Filed: Aug. 24, 1999

(30) Foreign Application Priority Data

Jun. 11, 1999 (TW) .................................... 88209607 U

(51) Int. Cl.
*H01L 23/34* (2006.01)
*H01L 23/36* (2006.01)
*H01L 23/367* (2006.01)
*H05K 1/02* (2006.01)
*H05K 3/34* (2006.01)

(52) U.S. Cl. .................. 361/717; 165/185; 165/80.2; 165/80.3; 174/16.3; 257/706; 257/717; 257/E23.101; 257/E23.105; 361/704; 361/707; 361/718; 361/719

(58) Field of Classification Search .................. None
See application file for complete search history.

(56) References Cited

To view the complete listing of prior art documents cited during the proceeding for Reexamination Control Number 90/011,487, please refer to the USPTO's public Patent Application Information Retrieval (PAIR) system under the Display References tab.

*Primary Examiner* — Deandra M. Hughes

(57) ABSTRACT

An integrated circuit package has a printed circuit board, a die mounted on the printed circuit board, and a heat spreader attached to the printed circuit board to cover the die and contact with the backside of the die. The heat spreader is formed by a piece body and a plurality of supporting leads extended downward from the periphery of the piece body. The supporting leads of the heat spreader are attached to the printed circuit board by surface mounting technology. The piece body of the heat spreader abuts on the backside of the die so that heat from the die can be conducted both upward to the outer environment and downward to the printed circuit board through the heat spreader, thereby enhancing the heat dissipation efficiency.

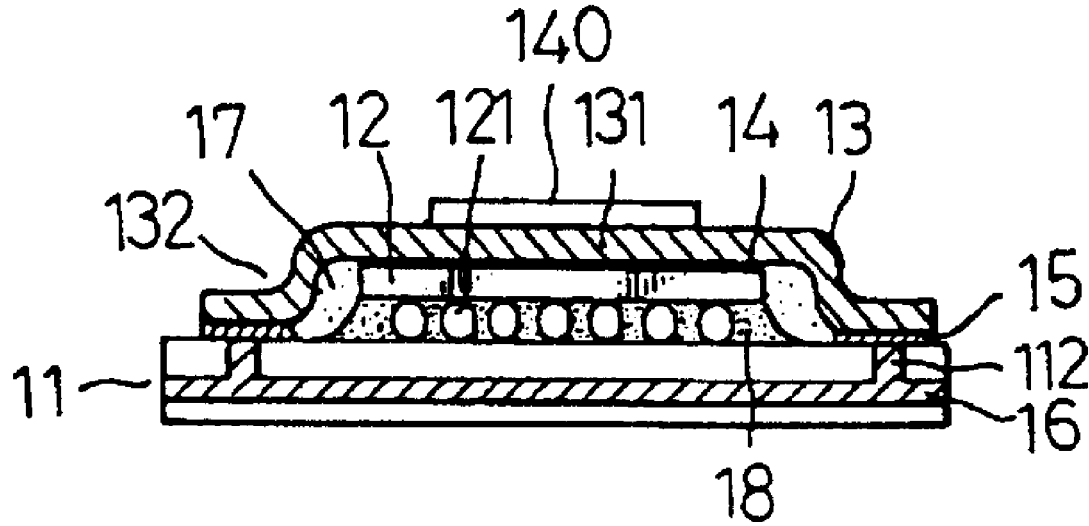

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 4-5 and 8 are determined to be patentable as amended.

Claims 2-3 and 6-7, dependent on an amended claim, are determined to be patentable.

New claims 9-13 are added and determined to be patentable.

1. An integrated circuit package comprising:
   a printed circuit board;
   a die attached to the printed circuit board; and
   a heat spreader covering the die, the heat spreader contacting [with] *a* backside of the die and being mounted to the printed circuit board;
   wherein the heat spreader is formed by a piece body and a plurality of supporting leads extended downward from a periphery of the piece body *to be out of plane with a surface of the die opposite the backside*;
   the printed circuit board has a surface [formed thereon] *with* a plurality of *spaced-apart* thermal pads disposed around the die; and
   the plurality of supporting leads of the heat spreader are secured, *with intermediate conductors,* to the plurality of *spaced-apart* thermal pads on the printed circuit board, respectively.

4. The integrated circuit package as claimed in claim 1, wherein the printed circuit board [defines] *has* a plurality of thermal via holes at positions where the plurality of thermal pads are formed[, respectively].

5. The integrated circuit package as claimed in claim [1] *4*, wherein the printed circuit board has an inner-layered copper plane, the plurality of thermal via holes being connected to the inner-layered copper plane.

8. The integrated circuit package as claimed in claim [1] *7*, wherein the material with high conductivity is thermal grease.

*9. The integrated circuit package as claimed in claim 1, wherein the printed circuit board has a plurality of thermal via holes at positions spaced apart from the thermal pads.*

*10. The integrated circuit package as claimed in claim 9, wherein the printed circuit board has an inner-layered copper plane, the plurality of thermal via holes being connected to the inner-layered copper plane.*

*11. The integrated circuit as claimed in claim 9, further comprising conductive material coupled between the pads and the vias on the printed circuit board.*

*12. The integrated circuit package as claimed in claim 11, wherein the printed circuit board has an inner-layered copper plane, the plurality of thermal via holes being connected to the inner-layered copper plane.*

*13. The integrated circuit package as claimed in claim 6, wherein the additional heat sink is mounted to a single heat spreader.*

\* \* \* \* \*